US012666933B2

(12) United States Patent
Lee et al.

(10) Patent No.: US 12,666,933 B2
(45) Date of Patent: Jun. 23, 2026

(54) LOW RESISTANCE LINER

(71) Applicant: Tokyo Electron Limited, Tokyo (JP)

(72) Inventors: Tek Po Rinus Lee, Albany, NY (US);
Gyanaranjan Pattanaik, Albany, NY
(US); Kenichi Imakita, Albany, NY
(US)

(73) Assignee: Tokyo Electron Limited, Tokyo (JP)

( * ) Notice: Subject to any disclaimer, the term of this
patent is extended or adjusted under 35
U.S.C. 154(b) by 337 days.

(21) Appl. No.: 18/508,387

(22) Filed: Nov. 14, 2023

(65) Prior Publication Data

US 2025/0157932 A1 May 15, 2025

(51) Int. Cl.
H10W 20/00 (2026.01)
H10W 20/41 (2026.01)
*H10W 20/42* (2026.01)

(52) U.S. Cl.
CPC ....... H10W 20/042 (2026.01); H10W 20/037
(2026.01); H10W 20/045 (2026.01); **H10W
20/063 (2026.01); H10W 20/425** (2026.01);
*H10W 20/42* (2026.01)

(58) Field of Classification Search
CPC ........... H10W 20/021; H10W 20/0261; H10W
20/032; H10W 20/033; H10W 20/036;
H10W 20/037; H10W 20/0372; H10W
20/042; H10W 20/045; H10W 20/049;
H10W 20/056; H10W 20/057; H10W
20/0595; H10W 20/063; H10W 20/0633;
H10W 20/0636; H10W 20/40; H10W
20/42; H10W 20/421; H10W 20/422;
H10W 20/425; H10W 20/44; H10W
20/4432; H10W 20/455; H10W 29/01
See application file for complete search history.

(56) References Cited

U.S. PATENT DOCUMENTS

| | | | |
|---|---|---|---|
| 6,444,502 | B1 | 9/2002 | Sanchez et al. |
| 6,462,367 | B2 | 10/2002 | Marsh et al. |
| 6,737,313 | B1 | 5/2004 | Marsh et al. |
| 7,438,949 | B2 | 10/2008 | Weidman |
| 9,496,419 | B2 | 11/2016 | Sharangpani et al. |
| 9,711,449 | B2 | 7/2017 | Yu et al. |
| 10,629,433 | B2 | 4/2020 | Ishizaka |
| 11,282,745 | B2 | 3/2022 | Yu et al. |
| 2014/0161992 | A1 | 6/2014 | Ishizaka et al. |
| 2020/0303251 | A1 | 9/2020 | Wada et al. |
| 2022/0246534 | A1 | 8/2022 | Chin et al. |
| 2023/0129619 | A1 | 4/2023 | Ok et al. |

FOREIGN PATENT DOCUMENTS

| | | |
|---|---|---|
| KR | 20140076514 A | 6/2014 |
| WO | 2023066643 A1 | 4/2023 |

OTHER PUBLICATIONS

International Search Report and Written Opinion, PCT No. PCT/
US2024/048394, Mailed Dec. 30, 2024, Total pp. 10.

*Primary Examiner* — Cheung Lee
(74) *Attorney, Agent, or Firm* — Slater Matsil, LLP

(57) ABSTRACT

A method of processing a substrate includes forming an
amorphous silicon (a-Si) layer over the substrate, where the
substrate includes a dielectric layer and a conductive layer,
and the a-Si liner covers a surface of the dielectric layer and
a surface of the conductive layer. The method includes
converting the a-Si liner into a silicon-containing layer
including a metal; and depositing the metal over the silicon-
containing layer using the silicon-containing layer as a seed
layer for the depositing, where the metal deposited over the
silicon-containing layer and the conductive layer are elec-
trically connected.

20 Claims, 7 Drawing Sheets

Figure 4B:
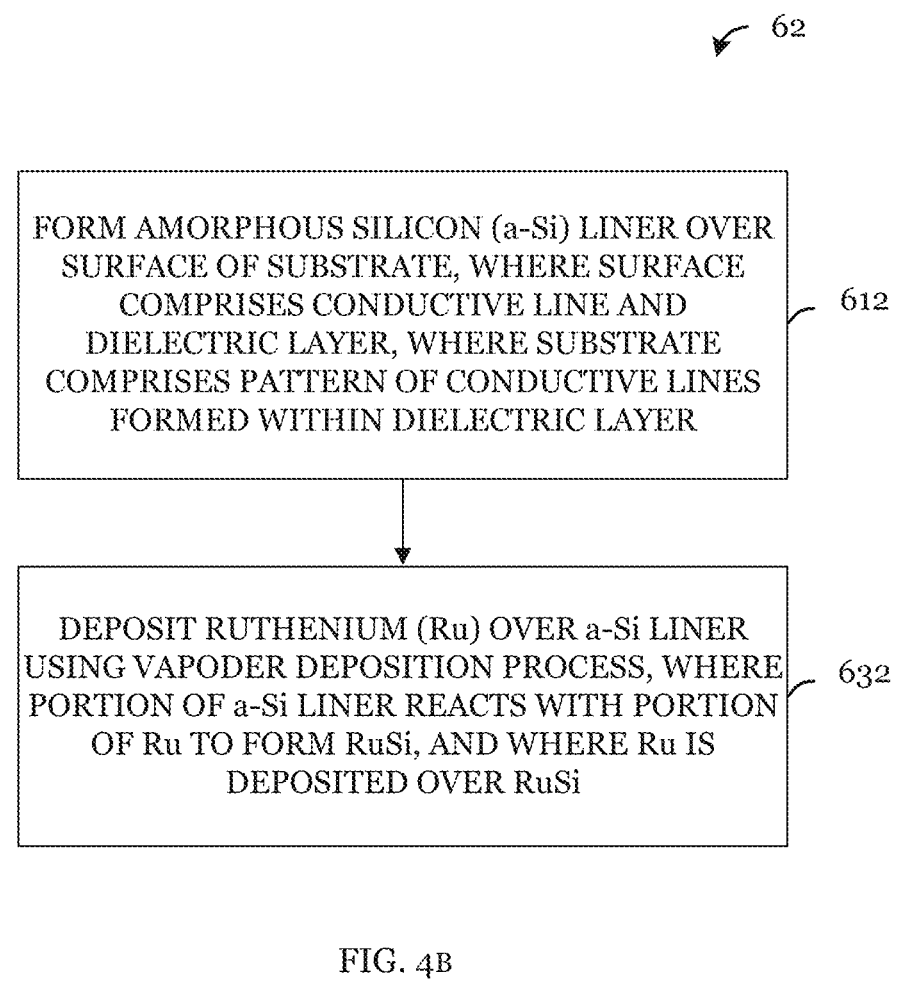

62

FORM AMORPHOUS SILICON (a-Si) LINER OVER
SURFACE OF SUBSTRATE, WHERE SURFACE
COMPRISES CONDUCTIVE LINE AND
DIELECTRIC LAYER, WHERE SUBSTRATE
COMPRISES PATTERN OF CONDUCTIVE LINES
FORMED WITHIN DIELECTRIC LAYER

612

DEPOSIT RUTHENIUM (Ru) OVER a-Si LINER
USING VAPODER DEPOSITION PROCESS, WHERE
PORTION OF a-Si LINER REACTS WITH PORTION
OF Ru TO FORM RuSi, AND WHERE Ru IS
DEPOSITED OVER RuSi

LOW RESISTANCE LINER

TECHNICAL FIELD

The present invention relates generally to methods of processing a substrate, and, in particular embodiments, to low resistance liner.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

The minimum dimension of features in a patterned layer is shrunk periodically to roughly double the component density at each successive technology node, thereby reducing the cost per function. Innovations in patterning, such as immersion deep ultraviolet (i-DUV) lithography, multiple patterning, and 13.5 nm wavelength extreme ultraviolet (EUV) optical systems have brought some critical dimensions down close to ten nanometers. As the miniaturization progresses further, new problems are emerging in copper (Cu) wiring. That is, the wiring width used in the device has become even small than the mean free path of electrons in a Cu material, causing an increase in resistance value due to scattering. Therefore, new wiring materials for metal interconnects with superior material properties and their fabrication techniques may be desired at increasingly smaller scales.

SUMMARY

In accordance with an embodiment of the present invention, a method of processing a substrate includes forming an amorphous silicon (a-Si) liner over the substrate, where the substrate includes a dielectric layer and a conductive layer, and the a-Si liner covers a surface of the dielectric layer and a surface of the conductive layer. The method includes converting the a-Si liner into a silicon-containing layer including a metal; and depositing the metal over the silicon-containing layer using the silicon-containing layer as a seed layer for the depositing, where the metal deposited over the silicon-containing layer and the conductive layer are electrically connected.

In accordance with an embodiment of the present invention, a method of processing a substrate includes forming an amorphous silicon (a-Si) liner over a surface of the substrate, where the surface includes a conductive line and a dielectric layer, and the substrate includes a pattern of conductive lines formed within the dielectric layer. The method includes depositing ruthenium (Ru) over the a-Si liner using a vapor deposition process, where a portion of the a-Si liner reacts with a portion of Ru to form RuSi at an initial stage of the vapor deposition process, and where Ru is deposited over RuSi.

In accordance with an embodiment of the present invention, a method of processing a substrate includes forming a recess in a dielectric layer of the substrate; filling the recess with ruthenium (Ru) using a chemical vapor deposition (CVD) process; and planarizing a surface of the substrate, where the surface after the planarizing includes the dielectric layer and Ru. The method includes forming an amorphous silicon (a-Si) liner over the surface; and depositing Ru over the a-Si liner using a physical vapor deposition (PVD) process.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1E illustrate cross sectional views of an example substrate during an example process of semiconductor fabrication comprising metal deposition with a silicon liner at various stages in accordance with various embodiments, wherein FIG. 1A illustrates an incoming substrate, FIG. 1B illustrates the substrate after a silicon liner formation, FIG. 1C illustrates the substrate after a metal deposition, FIG. 1D illustrates the substrate after patterning the metal, and FIG. 1E illustrates the substrate after dielectric-on-dielectric (DoD) deposition;

FIGS. 4A-4C illustrate process flow charts of methods of metal deposition with a silicon liner in accordance with various embodiments, wherein FIG. 4A illustrates an embodiment process flow, FIG. 4B illustrates an alternate embodiment process flow, and FIG. 4C illustrate another alternate embodiment process flow.

DETAILED DESCRIPTION OF ILLUSTRATIVE EMBODIMENTS

This application relates to a method of processing a substrate, more particularly to low resistance liner. Techniques herein may be applied to and useful in fabricating metal interconnects in semiconductor devices at small scale. As device feature size continues to scale down, minimizing the electrical resistance has become a significant challenge especially for tight metal pitch. For example, the interconnect-RC delay of conventional copper (Cu) lines and tungsten (W) contacts may be limiting the speed of digital circuits. New materials are being introduced at the 10 nm nodes and below to replace dense Cu lines and W contacts. Ruthenium (Ru) metal is a leading candidate for replacing copper and tungsten in these and other applications. However, there are unique technical challenges for the application of Ru metal in metal interconnects. One of them is the vertical resistance of a Ru/liner stack. In a conventional fabrication process of metal interconnect using Ru, an adhesion layer such as titanium nitride (TiN) and tantalum nitride (TaN) may be used to improve Ru adhesion to the surface. The inherent resistivity of the liner material and the interface between Ru and the liner may often result in increased vertical electrical resistance. It is, therefore, desirable to have a new method of forming a Ru/liner stack with low electrical resistance.

Embodiments of the present application disclose methods of forming a metal/liner stack with low resistance. In various embodiments, the methods may comprise forming a silicon liner (e.g., amorphous silicon) and vapor depositing a metal (e.g., Ru) over the silicon liner. During the vapor deposition or a separate annealing treatment, the silicon liner may react to form a metal silicide (e.g., RuSi) layer which may be a final form of the liner underlying the deposited metal. The inherent resistivity of the metal silicide can be at least an order of magnitude lower than conventional liner materials, making an excellent alternative liner material for metal deposition. The inventors of this application experimentally demonstrated that the metal deposition over the silicon liner is enabled with sufficient adhesion. The methods of metal deposition can therefore be advantageously applied in metal interconnect fabrication processes and may be used to form a metal via or metal line.

Figure 2:
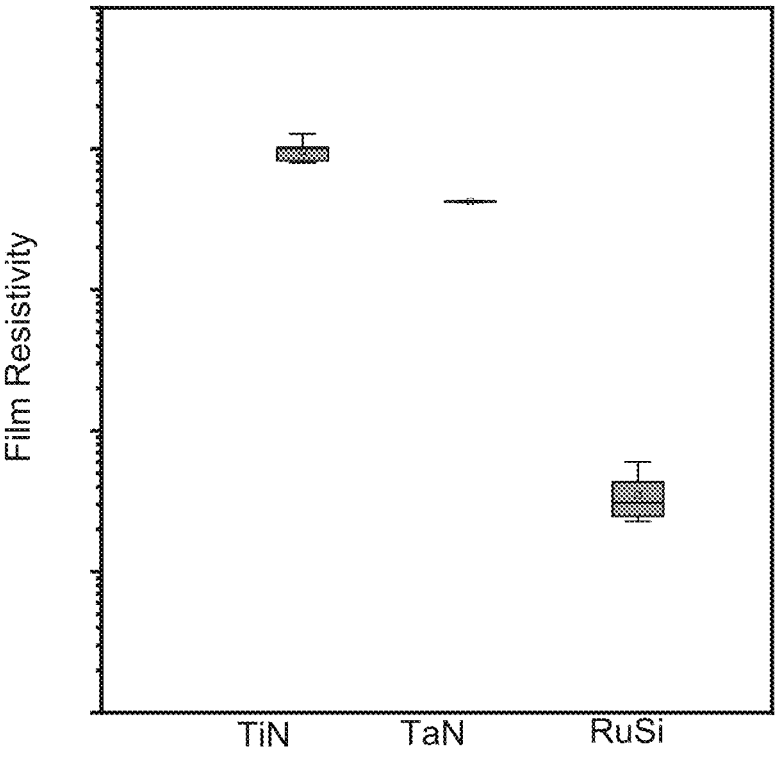
FIG. 2 illustrates film resistivity of conventional liner materials (TiN and TaN) and ruthenium silicide (RuSi)
Figure 3:
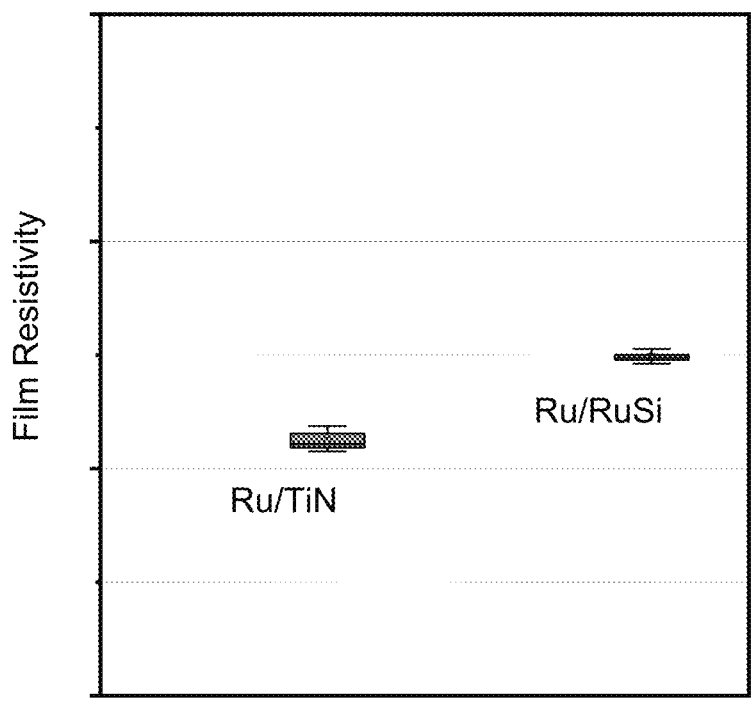
FIG. 3 illustrates film resistivity of Ru/TiN layer stack and Ru/RuSi layer stack.

In the following, FIGS. 1A-1E illustrate steps of a process of the metal deposition with a silicon liner in accordance with various embodiments. Example film resistivity data obtained for a RuSi liner and a Ru/RuSi stack are illustrated in FIGS. 2-3. Several embodiment process flows of metal deposition are described referring to FIGS. 4A-4C. All Figures in the disclosure, including the aspect ratios of features, are not to scale and for illustration purposes only. Although various embodiments of this disclosure primarily describe metal deposition particularly using ruthenium (Ru), the methods of deposition may be applied to deposit any appropriate metals, alloys, or other conductive materials as long as the silicon liner may be formed prior to the metal deposition. Accordingly, the term "metal" or "metal deposition" in this disclosure is not limited to a pure metal but used to include any conductive material (e.g., alloy and compounds) comprising at least one metal element. Further, any list that presents possible compositions, conditions, or process variations includes any reasonable combination thereof, and thus the term "or" used in the list does not indicate any exclusive selection of a particular composition, condition, or process variation.

FIGS. 1A-1E illustrate cross sectional views of an example substrate 100 during an example process of semiconductor fabrication comprising metal deposition with a silicon liner at various stages in accordance with various embodiments.

Figure 1A:
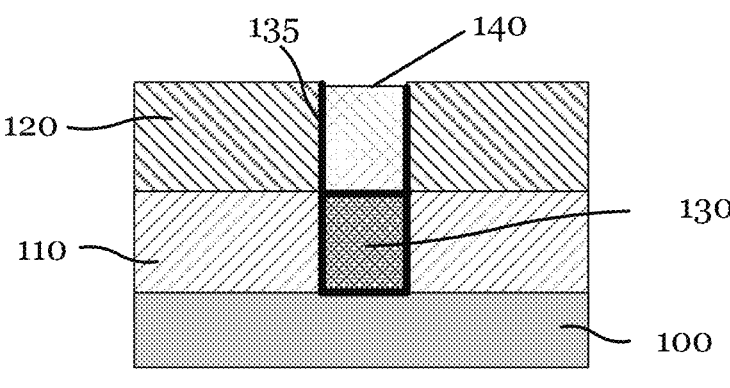

In FIG. 1A, the substrate 100 may be a part of, or include, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As illustrated in FIG. 1A, the substrate 100 may further comprise a first dielectric layer 110, interlayer dielectric (ILD) 120, a first conductive fill 130, and a second conductive fill 140. In various embodiments, the structure illustrated in FIG. 1A may be a part of a metal interconnect at an intermediate stage of a back-end-of-line (BEOL) process. Accordingly, in certain embodiments, the first conductive fill 130 may be a metal line (e.g., M1 layer) and the second conductive fill 140 may be a via, where the ILD 120 is formed for via formation. In certain embodiments, the first dielectric layer 110, the ILD 120, or both may comprise silicon oxide or a low-k dielectric such as fluorosilicate glass (FSG) or carbon-doped silicon oxide (CDO). In one or more embodiments, the first conductive fill 130, the second conductive fill 140, or both may comprise aluminum (Al), copper (Cu), tungsten (W), ruthenium (Ru), or osmium (Os). In one or more embodiments, the first conductive fill 130, the second conductive fill 140, or both may comprise molybdenum (Mo), niobium (Nb), nickel (Ni), or cobalt (Co).

In various embodiments, a series of materials deposition and patterning with photolithography and subsequent pattern transfers may be performed using conventional methods to form the structure of FIG. 1A. For example, a first recess (i.e., trench) may be formed in the first dielectric layer 110, the formed recess feature may be filled with the first conductive fill 130, the ILD 120 may be deposited over the substrate 100, a second recess (i.e., via) may be formed in the ILD 120, and the second recess may be filled with the second conductive fill 140.

In certain embodiments, the second conductive fill 140 may be deposited over the substrate using a vapor deposition technique such as atomic layer deposition (ALD), physical vapor deposition (PVD), chemical vapor deposition (CVD), or plasma-enhanced CVD (PECVD), followed by planarization to flatten the top surface. In one or more embodiments, chemical mechanical planarization (CMP) may be used for the planarization. In various embodiments, the first conductive fill 130 may comprise a metal line and it may have a critical dimension (CD) less than 50 nm, and in certain embodiments, less than 20 nm. In one or more embodiments. Accordingly, in certain embodiments, the second conductive fill 140 may comprise a metal via and it may have a CD less than 50 nm, and in one embodiment, less than 20 nm. Further, the metal via made of the second conductive fill 140 may have an aspect ratio (AR) between 2:1 and 100:1 in one embodiment.

In one or more embodiments, the second conductive fill 140 may comprise ruthenium (Ru), and chemical vapor deposition (CVD) may be used for its deposition. For example, a Ru precursor, ruthenium carbonyl ($Ru_3(CO)_{12}$) may be flowed into the deposition chamber containing the substrate 100, where ($Ru_3(CO)_{12}$) may be thermally decomposed on the surface and a high-purity thin Ru film may be formed within the recess 125. In one or more embodiments, the process conditions for Ru deposition may be as follows: the pressure within the deposition chamber in a range of 0.1 mTorr to 1 Torr, preferably in a range of 10 mTorr to 500 mTorr, and the substrate temperature in a range of 120° C. to 300° C., preferably in a range of 130° C. to 250° C. In various embodiments, the process temperature may be kept below 400° C. to be within a typical thermal budget in back-end-of-line (BEOL) processes.

In other embodiments, the Ru deposition may be performed using a Ru pentadienyl compound such as (cyclo-pentadienyl) (2,4-dimethylpentadienyl) ruthenium, bis(cy-clopentadienyl) (2,4-methylpentadienyl) ruthenium, (2,4-dimethylpentadienyl) (ethylcyclopentadienyl) ruthenium, or bis(2,4-methylpentadienyl) (ethylcyclopentadienyl) ruthenium. When using these precursors, the CVD may also use a reducing gas in addition to the Ru precursor.

Further, as illustrated in FIG. 1A, a liner 135 may be inserted at interfaces between the dielectric materials (e.g., the first dielectric layer 110 and ILD 120) and the conductive materials (e.g., the first and second conductive fills 130 and 140). The liner 135 may be a barrier layer to prevent diffusion of atoms across the interfaces, an adhesion layer to improve adhesion of fill material over the surface, or a combination thereof. In certain embodiments, the liner 135 may comprise titanium, titanium nitride, tantalum, tantalum nitride, tungsten, molybdenum, cobalt, or a combination thereof. In certain embodiments, the thickness of the liner 135 may be in a range of 0.1 nm to 10 nm. The liner 135 may be formed by, for example, ALD, PVD, CVD, or PECVD.

Continuing the process to fabricating the metal interconnect, the next step may be another metal deposition (e.g., Ru) over the substrate to form a next metal line. In conventional methods, another liner such as titanium nitride or tantalum nitride, similar to the liner 135 may be used for better metal adhesion. In various embodiments, however, the methods of metal deposition may use a silicon liner instead of conventional metal nitride materials as further described below (FIGS. 1B-1E).

Figure 1B:
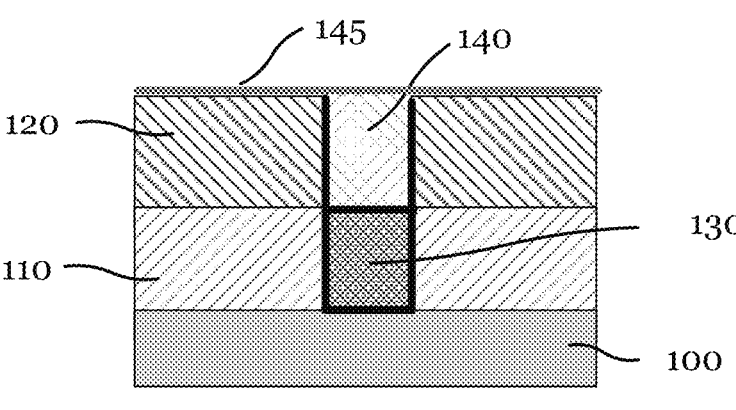

FIG. 1B illustrates a cross sectional view of the substrate 100 after a silicon liner formation.

In various embodiments, a silicon liner 145 comprising silicon (Si) may be deposited over the top surface of the substrate 100 (e.g., exposed surfaces of the ILD 120 and the second conductive fill 140) using a vapor deposition technique such as ALD, PVD, CVD, or PECVD. In various embodiments, the process temperature may be kept below 400° C. to be within a typical thermal budget in back-end-of-line (BEOL) processes. In certain embodiments, the silicon liner 145 may comprise amorphous silicon (a-Si). In certain embodiments, the silicon liner 145 may have a thickness between 0.1 nm to 10 nm.

Figure 1C:
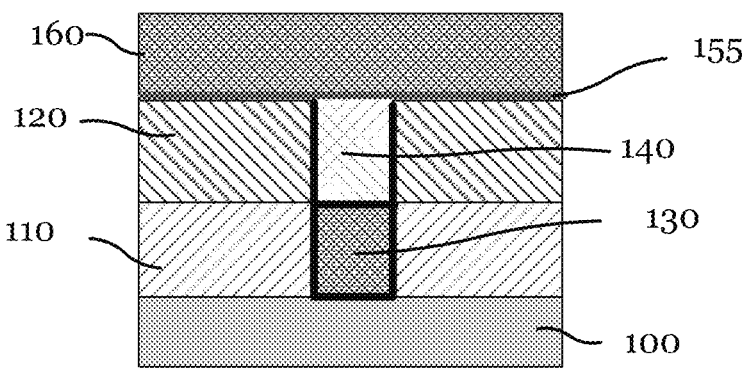

Although FIGS. 1A-1E illustrates embodiments with the silicon liner 145 formed over a flat surface, in other embodiments, it may be conformally formed over a patterned, non-flat surface. In various embodiments, the silicon liner 145 may advantageously improve the adhesion of a conductive material deposited in a subsequent deposition step (FIG. 1C).

In certain embodiments, a pre treatment step such a surface cleaning process may be performed prior to the next step described below.

FIG. 1C illustrates a cross sectional view of the substrate 100 after a metal deposition.

After the silicon liner formation, the metal deposition step may be performed. In various embodiments, the silicon liner formation of FIG. 1B and the metal deposition of FIG. 1C may be performed in the same process chamber. In various embodiments, this deposition step may not be limited to a pure metal, and any alloys or conductive materials may be used. An electrically conductive material (referred to as conductive material 160 in this disclosure) may be deposited using a vapor deposition process to over the substrate 100, covering the silicon liner 145 formed in FIG. 1B. In various embodiments, the conductive material 160 may comprise ruthenium (Ru). In certain embodiments, the Ru deposition may be performed by a PVD process such as sputtering deposition. In certain embodiments, the Ru deposition may also be performed by a CVD process including plasma enhanced CVD provided the underlying silicon liner 145 and the conductive material 160 are deposited in the same chamber without exposure to atmosphere. In various embodiments, the metal deposition process may be performed at a temperature between 200° C. and 350° C. In one embodiment with the sputtering deposition of Ru, a Ru target may be bombarded with energized argon ions (Art) to deposit a Ru film over the substrate 100.

In alternate embodiments, the conductive material 160 may comprise aluminum (Al), copper (Cu), cobalt (Co), tungsten (W), osmium (Os), molybdenum (Mo), niobium (Nb), or nickel (Ni).

In various embodiments, silicon (e.g., a-Si) of the silicon liner 145 may react during the metal deposition to form metal silicide (e.g., RuSi), referred to as a reacted liner 155 in this disclosure. The reacted liner 155 may comprise silicon and the metal of the conductive material 160. The formation of the metal silicide in the reacted liner 155 may substantially decrease the resistivity of the silicon liner 145, and may be advantageous as a stable, final form of the liner left in the metal interconnects with minimal electrical resistance. Further, although not wishing to be limited by any theory, the formation of the metal silicide may be a self-limiting process and the initial thickness of the silicon liner 145 may determine the thickness of the reacted liner 155. The self-limiting feature may be beneficial in controlling the thickness of the liner thickness and ensuring that only a small portion of the metal is used for the metal silicide without substantially affecting the efficiency of metal deposition to form a conductive pattern.

The process temperature for the metal deposition may provide sufficient thermal energy to induce the reaction for metal silicide formation. In certain embodiments, an optional post-deposition annealing treatment may be performed. For example, the substrate 100 may be heated to a temperature between 200° C. and 350° C. using an inert gas flow. The annealing treatment may have several purposes. First, it may be beneficial to ensure the metal silicide formation in the silicon liner 145 in case the metal deposition alone was not sufficient for the reaction to complete, for example, when a relatively lower temperature is used for the metal deposition. Further, the annealing treatment may improve the crystallinity of the conductive material 160 by increasing the grain diameter of crystals and reducing the grain boundaries within the reacted liner 155. The better crystallinity may advantageously reduce the resistivity and also help the performance of the subsequent etch process by reducing line edge roughness (LER) and line width roughness (LWR). It may also remove impurities such as, for example, carbon or oxygen in the conductive material 160. The optional annealing treatment may be performed using a gas containing $H_2$ gas, for example, a forming gas ($H_2$+Ar or $H_2$+$N_2$).

Although the reacted liner 155 is illustrated as a uniform layer in FIG. 1C, in certain embodiments, it may comprise more than one composition. For example, the chemical composition of the reacted liner 155 may depend on the underlying layer (e.g., the second conductive fill 140 and the ILD 120), and it may comprise a metal silicate (e.g., $RuSi_xO_y$) selectively formed over the second ILD 170 as well as metal silicide (e.g., RuSi) selectively formed over the second conductive fill 140.

Figure 1D:
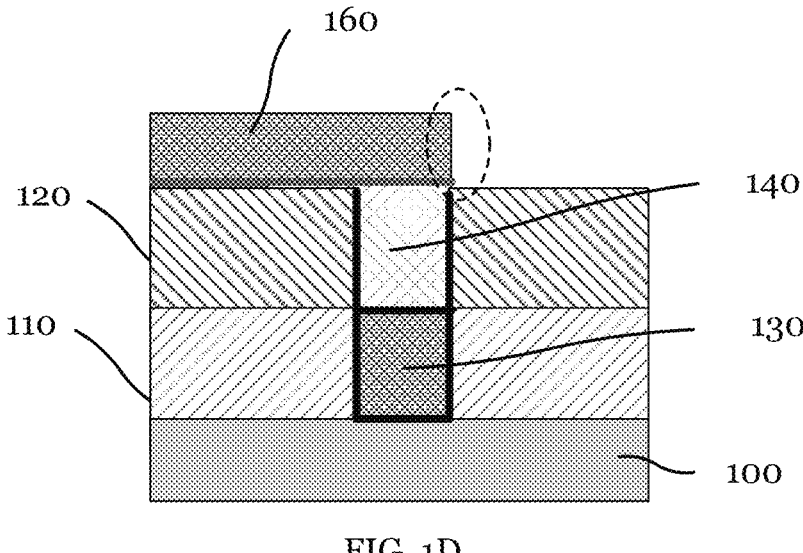

FIG. 1D illustrates a cross sectional view of the substrate 100 after patterning the metal.

After the metal deposition, the conductive material 160 may be patterned, for example, to form a metal line. The patterning may be performed using a subtractive etch of the conductive material 160 with an etch mask. In various embodiments, a plasma etch process based on oxygen etch chemistry may be used. In one or more embodiments, dioxygen ($O_2$) may be used in the plasma etch process. In FIG. 1D, in certain embodiments, a patterned portion of the conductive material 160 may be a metal line aligned to the metal via of the second conductive fill 140 and perpendicular to the lower metal line of the first conductive fill 130. It should be noted that the illustrated pattern of the conductive material 160 is for example only, and any other reasonable patterning may be performed.

As mentioned above, the crystallinity of the conductive material 160 may affect the etch performance. In particular, during the patterning of the conductive material 160, line edge roughness (LER) and line width roughness (LWR) need to be controlled to be within the acceptable limit. A sidewall of the conductive material 160 where these parameters may be important is indicated by a dotted circle in FIG. 1D. A higher crystallinity with less grain boundaries in the conductive material 160 may be preferable, which may be enabled by the use of metal silicide instead of conventional metal nitride liner materials.

Figure 1E:
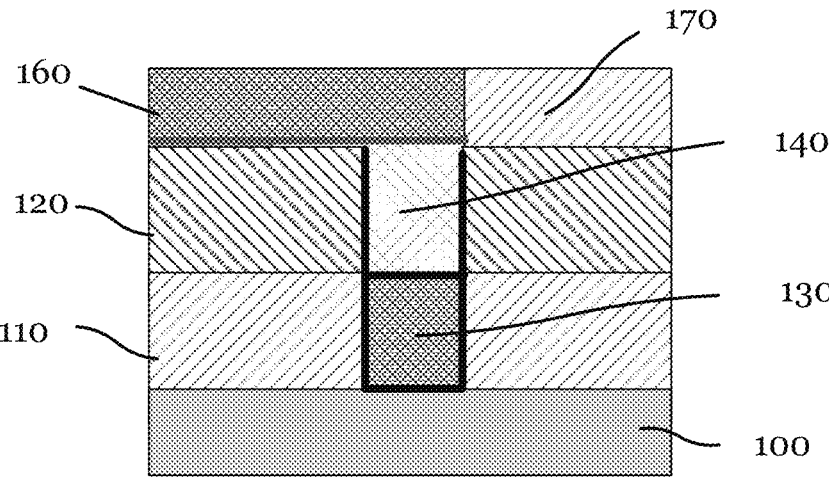

FIG. 1E illustrates a cross sectional view of the substrate 100 after dielectric-on-dielectric (DoD) deposition.

After the patterning of the conductive material 160, a second interlayer dielectric (ILD) 170 may be formed to further proceed the metal interconnect fabrication process. In various embodiments, the second ILD 170 may be selectively grown over the ILD 120 using a dielectric-on-dielectric (DoD) deposition technique.

The process flow described above referring to FIGS. 1A-1E applies the silicon liner prior to depositing the conductive material 160 over the layer stack structure of the substrate 100, advantageously replacing a conventional metal nitride adhesion layer. The position and surface level where the silicon liner is applied in FIGS. 1A-1E are for example only, and in various embodiments, the methods of silicon liner and metal deposition can also be applied to other levels where a liner may be used for metal deposition. In certain embodiments, a portion or the entirety of the liner 135 in FIG. 1A may also potentially be replaced with a silicon liner, and the silicon liner can advantageously be used for a seed layer and adhesion layer to deposit the first conductive fill 130, the second conductive fill 140, or both. Further, in other embodiments, any metal via or metal lines for a metal interconnect structure may be formed using the silicon liner in the same way as described above in the prior embodiments.

FIG. 2 illustrates film resistivity of conventional liner materials (TiN and TaN) and ruthenium silicide (RuSi).

FIG. 3 illustrates film resistivity of Ru/TiN layer stack and Ru/RuSi layer stack.

The inventors of this application demonstrated the superior electrical conductivity of metal silicide compared to conventional liner materials by experimentally investigating the film resistivity of the bulk materials and layer stacks. First, ruthenium silicide (RuSi), titanium nitride (TiN), and tantalum nitride (TaN) were examined for their film resistivity. In FIG. 2, the film resistivity for the three materials were plotted in a logarithmic scale. The RuSi film exhibited a film resistivity more than one order, nearly two orders, of magnitude smaller than those of TiN and TaN, supporting that RuSi can be an attractive candidate as a liner material where low resistance is desired. Next, in order to investigate any effect of the seed layer on the property of the metal deposited, the film resistivity of film stacks were also examined using Ru/TiN layer stack and Ru/RuSi layer stack. As illustrated in FIG. 3, the two samples exhibited comparable film resistivity, indicating that there is no substantial adverse effect of the RuSi liner on the conductivity of the Ru metal formed over the liner. It should be noted that the measurements were conducted for film resistivity and the current flows primarily through the top Ru portion of the layer stack.

Further, in a separate experiment of tape test, the inventors of this application confirmed the metal adhesion over the RuSi liner was sufficiently strong and therefore RuSi can be indeed used as an adhesion layer for the Ru deposition.

Grazing incidence X-ray diffraction (GIXRD) measurements were also performed to characterize the phases of Ru metal grown on the RuSi liner. Compared to the Ru metal grown on the TiN liner, the Ru metal on the RuSi liner exhibits a preferred orientation of crystal growth evidenced by a less number of peaks from different phases. This trend is common in both the out-of-plane and the in-plane measurements. As previously described above, the better crystallinity, as opposed to polycrystalline with many phases and grain boundaries, may advantageously reduce the resistivity and also help the performance of the subsequent etch process by reducing line edge roughness (LER) and line width roughness (LWR). The GIXRD data suggests that the RuSi may result in a better quality of Ru deposited than a conventional metal nitride liner regardless of whether an optional annealing treatment is performed.

Figure 4A:
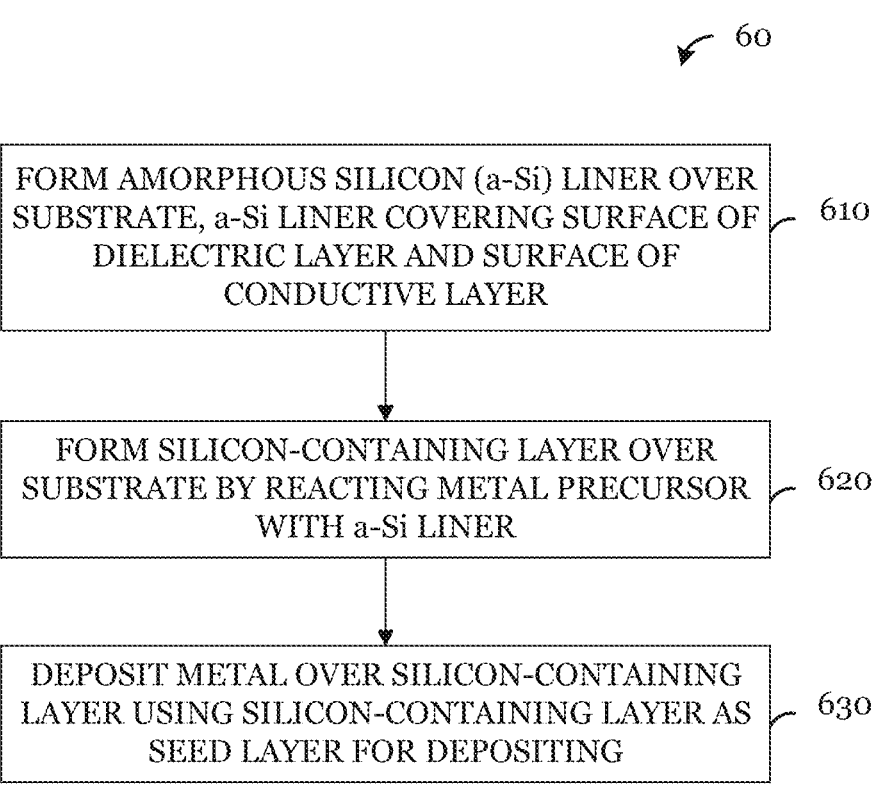
Figure 4C:
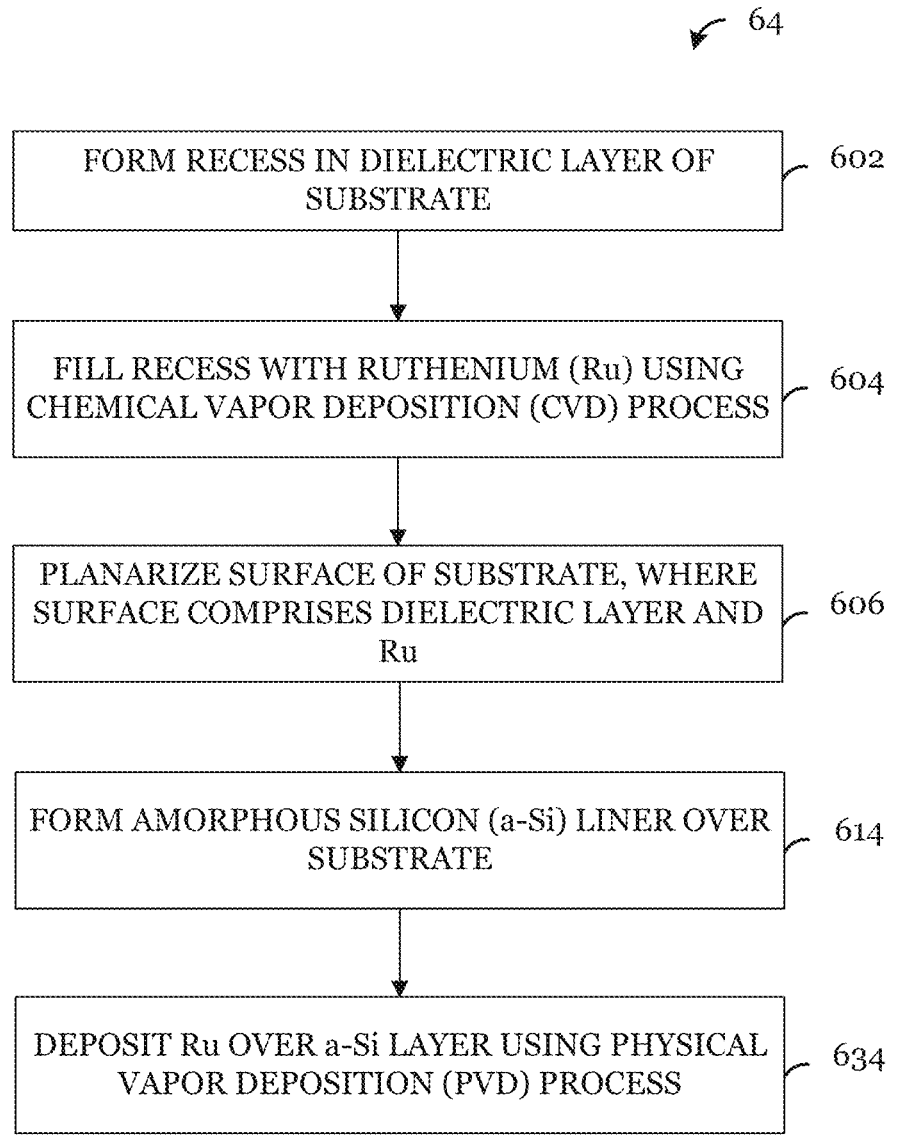

FIGS. 4A-4C illustrate process flow charts of methods of metal deposition with a silicon liner in accordance with various embodiments. The process flow can be followed with the figures (e.g., FIGS. 1A-1C) discussed above and hence will not be described again.

In FIG. 4A, a process flow 60 starts with forming an amorphous silicon (a-Si) liner over a substrate comprising a dielectric layer and a conductive layer, where the a-Si liner covers a surface of the dielectric layer and a surface of the conductive layer (block 610, FIG. 1B). Subsequently, the a-Si liner may be converted into a silicon-containing layer comprising a metal (block 620, FIG. 1C). The metal may then be deposited over the silicon-containing layer using the silicon-containing layer as a seed layer for the depositing, where the metal deposited over the silicon-containing layer and the conductive layer are electrically connected (block 630, FIG. 1C). In certain embodiments, the conversion of the a-Si liner and the metal deposition may be performed as a single step of a vapor deposition process.

In FIG. 4B, another process flow 62 starts with forming an amorphous silicon (a-Si) liner over a surface of the substrate, where the surface may comprise a conductive line and a dielectric layer, and where the substrate comprises a pattern of conductive lines formed within the dielectric layer (block 612, FIG. 1B). Subsequently, ruthenium (Ru) may be deposited over the a-Si liner using a vapor deposition process, where a portion of the a-Si liner reacts with a portion of Ru to form RuSi at an initial stage of the vapor deposition process, and where Ru is deposited over RuSi (block 632, FIG. 1C).

In FIG. 4C, another process flow 64 starts with forming a recess in a dielectric layer of a substrate (block 602) and filling the recess with ruthenium (Ru) using a chemical vapor deposition (CVD) process (block 604), followed by planarizing a surface of the substrate, where the surface after the planarizing may comprise the dielectric layer and Ru (block 606, FIG. 1A). Subsequently, an amorphous silicon (a-Si) liner may be formed over the surface (block 614, FIG. 1B). Ru may then be deposited over the a-Si liner using a physical vapor deposition (PVD) process (block 634, FIG. 1C).

Example embodiments of the invention are described below. Other embodiments can also be understood from the entirety of the specification as well as the claims filed herein.

Example 1. A method of processing a substrate includes forming an amorphous silicon (a-Si) layer over the substrate, where the substrate includes a dielectric layer and a conductive layer, and the a-Si liner covers a surface of the dielectric layer and a surface of the conductive layer. The method includes converting the a-Si liner into a silicon-containing layer including a metal; and depositing the metal over the silicon-containing layer using the silicon-containing layer as a seed layer for the depositing, where the metal deposited over the silicon-containing layer and the conductive layer are electrically connected.

Example 2. The method of example 1, further including, after the depositing, patterning the metal by performing a subtractive dry etch process.

Example 3. The method of one of examples 1 or 2, where the converting includes: exposing the a-Si liner to a vapor including the metal; and heating the substrate to a temperature between 200° C. and 350° C. to react the metal with the a-Si liner.

Example 4. The method of one of examples 1 to 3, where the converting and the depositing are performed as a single process including exposing the substrate to a vapor including the metal.

Example 5. The method of one of examples 1 to 4, where the single process is performed at a temperature between 200° C. and 350° C.

Example 6. The method of one of examples 1 to 5, where the conductive layer includes aluminum (Al), copper (Cu), cobalt (Co), tungsten (W), ruthenium (Ru), osmium (Os), molybdenum (Mo), niobium (Nb), or nickel (Ni).

Example 7. The method of one of examples 1 to 6, where the metal includes ruthenium (Ru).

Example 8. The method of one of examples 1 to 7, where the silicon-containing layer includes a metal silicide.

Example 9. The method of one of examples 1 to 8, where the silicon-containing layer includes a metal silicide formed over the conductive layer and a metal silicate formed over the dielectric layer.

Example 10. A method of processing a substrate includes forming an amorphous silicon (a-Si) layer over a surface of the substrate, where the surface includes a conductive line and a dielectric layer, and the substrate includes a pattern of conductive lines formed within the dielectric layer. The method includes depositing ruthenium (Ru) over the a-Si liner using a vapor deposition process, where a portion of the a-Si liner reacts with a portion of Ru to form RuSi at an initial stage of the vapor deposition process, and where Ru is deposited over RuSi.

Example 11. The method of example 10, where the a-Si liner has a thickness between 1 nm and 5 nm.

Example 12. The method of one of examples 10 to 11, where the pattern of conductive lines has a pitch size between 5 nm and 20 nm. 13. The method of one of examples 1 to 11, where the vapor deposition process is performed at a temperature between 200° C. and 350° C.

Example 14. The method of one of examples 10 to 13, where the vapor deposition process is an atomic layer deposition (ALD) process, a physical vapor deposition (PVD) process, a chemical vapor deposition (CVD) process, or a plasma-enhanced CVD (PECVD) process.

Example 15. The method of one of examples 10 to 14, where the a-Si liner is formed by an atomic layer deposition (ALD) process, a physical vapor deposition (PVD) process, a chemical vapor deposition (CVD) process, or a plasma-enhanced CVD (PECVD) process.

Example 16. A method of processing a substrate includes forming a recess in a dielectric layer of the substrate; filling the recess with ruthenium (Ru) using a chemical vapor deposition (CVD) process; and planarizing a surface of the substrate, where the surface after the planarizing includes the dielectric layer and Ru. The method includes forming an amorphous silicon (a-Si) layer over the surface; and depositing Ru over the a-Si liner using a physical vapor deposition (PVD) process.

Example 17. The method of example 16, further including, after depositing Ru, patterning the PVD-deposited Ru to form a portion of a metal interconnect for a device component fabricated over the substrate.

Example 18. The method of one of examples 16 or 17, further including, after depositing Ru, performing an annealing process to increase the crystallinity of the PVD-deposited Ru.

Example 19. The method of one of examples 16 to 18, where the PVD process induces a reaction of the a-Si liner to a layer including RuSi, and where the layer acts as a seed layer for the Ru deposition.

Example 20. The method of one of examples 16 to 19, where the PVD process is performed at a temperature between 200° C. and 350° C.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:

forming an amorphous silicon (a-Si) liner over the substrate, the substrate comprising a dielectric layer and a conductive layer, the a-Si liner covering a surface of the dielectric layer and a surface of the conductive layer;

converting the a-Si liner into a silicon-containing layer comprising a metal; and depositing the metal over the silicon-containing layer using the silicon-containing layer as a seed layer for the depositing, wherein the metal deposited over the silicon-containing layer and the conductive layer are electrically connected.

2. The method of claim 1, further comprising, after the depositing, patterning the metal by performing a subtractive dry etch process.

3. The method of claim 1, wherein the converting comprises:

exposing the a-Si liner to a vapor comprising the metal; and heating the substrate to a temperature between 200° C. and 350° C. to react the metal with the a-Si liner.

4. The method of claim 1, wherein the converting and the depositing are performed as a single process comprising exposing the substrate to a vapor comprising the metal.

5. The method of claim 4, wherein the single process is performed at a temperature between 200° C. and 350° C.

6. The method of claim 1, wherein the conductive layer comprises aluminum (Al), copper (Cu), cobalt (Co), tungsten (W), ruthenium (Ru), osmium (Os), molybdenum (Mo), niobium (Nb), or nickel (Ni).

7. The method of claim 1, wherein the metal comprises ruthenium (Ru).

8. The method of claim 1, wherein the silicon-containing layer comprises a metal silicide.

9. The method of claim 1, wherein the silicon-containing layer comprises a metal silicide formed over the conductive layer and a metal silicate formed over the dielectric layer.

10. A method of processing a substrate, the method comprising:

forming an amorphous silicon (a-Si) liner over a surface of the substrate, the surface comprising a conductive line and a dielectric layer, the substrate comprising a pattern of conductive lines formed within the dielectric layer; and depositing ruthenium (Ru) over the a-Si liner using a vapor deposition process, wherein a portion of the a-Si liner reacts with a portion of the Ru to form RuSi at an initial stage of the vapor deposition process, and wherein the Ru is deposited over the RuSi.

11. The method of claim 10, wherein the a-Si liner has a thickness between 1 nm and 5 nm.

12. The method of claim 10, wherein the pattern of conductive lines has a pitch size between 5 nm and 20 nm.

13. The method of claim 10, wherein the vapor deposition process is performed at a temperature between 200° C. and 350° C.

14. The method of claim 10, wherein the vapor deposition process is an atomic layer deposition (ALD) process, a physical vapor deposition (PVD) process, a chemical vapor deposition (CVD) process, or a plasma-enhanced CVD (PECVD) process.

15. The method of claim 10, wherein the a-Si liner is formed by an atomic layer deposition (ALD) process, a physical vapor deposition (PVD) process, a chemical vapor deposition (CVD) process, or a plasma-enhanced CVD (PECVD) process.

16. A method of processing a substrate, the method comprising:

forming a recess in a dielectric layer of the substrate;

filling the recess with ruthenium (Ru) using a chemical vapor deposition (CVD) process;

planarizing a surface of the substrate, the surface after the planarizing comprising the dielectric layer and Ru;

forming an amorphous silicon (a-Si) liner over the surface; and depositing Ru over the a-Si liner using a physical vapor deposition (PVD) process.

17. The method of claim 16, further comprising, after depositing Ru, patterning the PVD-deposited Ru to form a portion of a metal interconnect for a device component fabricated over the substrate.

18. The method of claim 16, further comprising, after depositing Ru, performing an annealing process to increase the crystallinity of the PVD-deposited Ru.

19. The method of claim 16, wherein the PVD process induces a reaction of the a-Si liner to a layer comprising RuSi, and wherein the layer acts as a seed layer for the Ru deposition.

20. The method of claim 16, wherein the PVD process is performed at a temperature between 200° C. and 350° C.

\* \* \* \* \*